(12) United States Patent
Ishimoto et al.

(10) Patent No.: US 12,641,920 B2
(45) Date of Patent: May 26, 2026

(54) SEMICONDUCTOR LIGHT-EMITTING ELEMENT AND METHOD FOR MANUFACTURING SEMICONDUCTOR LIGHT-EMITTING ELEMENT

(71) Applicant: KOITO MANUFACTURING CO., LTD., Tokyo (JP)

(72) Inventors: Seiji Ishimoto, Shizuoka (JP); Daiki Jinno, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 421 days.

(21) Appl. No.: 18/563,665

(22) PCT Filed: May 9, 2022

(86) PCT No.: PCT/JP2022/019712
§ 371 (c)(1),
(2) Date: Nov. 22, 2023

(87) PCT Pub. No.: WO2022/249873
PCT Pub. Date: Dec. 1, 2022

(65) Prior Publication Data
US 2024/0274749 A1 Aug. 15, 2024

(30) Foreign Application Priority Data

May 27, 2021 (JP) ................................. 2021-089283

(51) Int. Cl.
*H01L 33/04* (2010.01)
*H01L 33/24* (2010.01)
(Continued)

(52) U.S. Cl.
CPC .... *H10H 20/811* (2025.01); *H10H 20/01335* (2025.01); *H10H 20/821* (2025.01)

(58) Field of Classification Search
None
See application file for complete search history.

(56) References Cited

U.S. PATENT DOCUMENTS

| | | | |
|---|---|---|---|
| 10,573,781 B1 * | 2/2020 | Munkholm | .......... H10H 20/825 |
| 2020/0075809 A1 * | 3/2020 | Rajan | .................... H10H 20/817 |

(Continued)

FOREIGN PATENT DOCUMENTS

| | | |
|---|---|---|
| JP | 2020-77817 A | 5/2020 |

OTHER PUBLICATIONS

International Search Report (ISA/210) dated Jun. 21, 2022, issued by the International Searching Authority in counterpart PCT/JP2022/019712.

(Continued)

*Primary Examiner* — Asok K Sarkar
(74) *Attorney, Agent, or Firm* — Sughrue Mion, PLLC

(57) ABSTRACT

A semiconductor light-emitting element includes a growth substrate, a plurality of columnar semiconductor layers formed on the growth substrate, a p-type embedded semiconductor layer that is in contact with side surfaces of the plurality of columnar semiconductor layers and that covers the columnar semiconductor layers, a tunnel junction layer formed on the embedded semiconductor layer, and an n-type semiconductor layer formed on the tunnel junction layer. A mesa structure is formed in the embedded semiconductor layer, the tunnel junction layer, and the n-type semiconductor layer. The tunnel junction layer is formed to extend up to a side surface of the mesa structure.

9 Claims, 10 Drawing Sheets

(51) Int. Cl.
    H10H 20/01         (2025.01)
    H10H 20/811     (2025.01)
    H10H 20/821     (2025.01)

(56) References Cited

U.S. PATENT DOCUMENTS

| | | | |
|---|---|---|---|
| 2021/0074877 A1* | 3/2021 | Kamiyama | H10H 20/813 |
| 2021/0193731 A1* | 6/2021 | Armitage | H10H 20/825 |
| 2022/0149237 A1* | 5/2022 | Armitage | H10H 29/142 |
| 2022/0190198 A1* | 6/2022 | Wildeson | H10H 20/812 |

OTHER PUBLICATIONS

International Written Opinion (ISA/237) dated Jun. 21, 2022, issued by the International Searching Authority in counterpart PCT/JP2022/019712.

* cited by examiner

10

SEMICONDUCTOR LIGHT-EMITTING ELEMENT AND METHOD FOR MANUFACTURING SEMICONDUCTOR LIGHT-EMITTING ELEMENT

CROSS-REFERENCE TO RELATED APPLICATIONS

This application is a National Phase Entry of PCT International Application No. PCT/JP2022/019712, filed on May 9, 2022, which claims priority to Japanese Patent Application No. 2021-089283 filed on May 27, 2021, the disclosures of which are incorporated herein in their entireties by reference.

TECHNICAL FIELD

The present disclosure relates to a semiconductor light-emitting element and a method for manufacturing a semiconductor light-emitting element, and more particularly, to a semiconductor light-emitting element having a structure in which a plurality of columnar semiconductor layers are embedded in a p-type embedded semiconductor layer and a method for manufacturing a semiconductor light-emitting element.

BACKGROUND ART

In recent years, a method for growing a crystal of a nitride-based semiconductor has rapidly progressed, and blue and green light-emitting elements having high luminance using this material have been put into practical use. When a red light-emitting element existing in the related art is combined with the blue light-emitting element and the green light-emitting element, all three primary colors of light are available, and a full-color display device can be implemented. That is, when all the three primary colors of light are mixed, white light can be obtained, and application to a lighting device is also possible.

In a semiconductor light-emitting element used as a light source for illumination, it is desirable that high energy conversion efficiency and high light output can be achieved in a high current density region, and it is desirable that distribution characteristics of emitted light be stable. To solve this problem, Patent Literature 1 proposes a semiconductor light-emitting element in which an n-type nanowire core, an active layer, and a p-type layer are grown on a growth substrate, a tunnel junction layer is formed on a side surface of the p-type layer, and is embedded by an n-type embedded semiconductor layer.

In the semiconductor light-emitting element disclosed in Patent Literature 1 in which the active layer is formed on an outer periphery of the nanowire core, crystal defects and threading dislocations are less than those in a semiconductor light-emitting element in which the active layer is formed on an entire surface of the growth substrate, and a high-quality crystal can be obtained. Further, since m-plane growth is possible, the external quantum efficiency at a high current density can be improved. In the semiconductor light-emitting element using the nanowire core of Patent Literature 1, the active layer can be formed of a high-quality crystal, and thus it is expected to increase an In composition of the active layer to achieve a long wavelength. Since the tunnel junction layer is formed around the nanowire and the nanowire is embedded by the n-type embedded semiconductor layer, it is possible to diffuse a current in the embedded semiconductor layer and favorably inject carriers from the tunnel junction layer into the p-type layer.

CITATION LIST

Patent Literature

Patent Literature 1: JP2020-077817A

SUMMARY OF INVENTION

Technical Problem

However, in the technique of Patent Literature 1 in the related art, the p-type layer and the tunnel junction layer are formed as a part of a columnar semiconductor including the nanowire, and the p-type layer and a p+ layer provided in the tunnel junction layer are embedded in the n-type semiconductor layer. For this reason, it may be difficult to increase a carrier concentration by desorbing hydrogen atoms contained in the p-type layer and the p+ layer and activating p-type impurities in a manufacturing processing. When the carrier concentration in the p-type layer and the p+ layer is low, it is difficult to inject carriers into the p-type layer, and accordingly it is difficult to increase a current density of the semiconductor light-emitting element and increase the amount of light.

The present disclosure is made in view of the above problems in the related art, and an object of the present disclosure is to provide a semiconductor light-emitting element and a method for manufacturing a semiconductor light-emitting element that can improve an activation rate of p-type impurities contained in a p-type layer and a p+ layer provided in a tunnel junction layer and perform favorable current diffusion and carrier injection.

Solution to Problem

In order to solve the above problem, a semiconductor light-emitting element of the present disclosure includes: a growth substrate; a plurality of columnar semiconductor layers formed on the growth substrate; a p-type embedded semiconductor layer that is in contact with side surfaces of the plurality of columnar semiconductor layers and that covers the columnar semiconductor layers; a tunnel junction layer formed on the embedded semiconductor layer; and an n-type semiconductor layer formed on the tunnel junction layer, in which a mesa structure is formed in the embedded semiconductor layer, the tunnel junction layer, and the n-type semiconductor layer, and the tunnel junction layer is formed to extend up to a side surface of the mesa structure.

According to the semiconductor light-emitting element of the present disclosure, the tunnel junction layer is formed on the p-type embedded semiconductor layer and extends to the side surface of the mesa structure. Accordingly, hydrogen can be desorbed through the embedded semiconductor layer and the tunnel junction layer exposed at the side surface of the mesa structure in an activation step, an activation rate of p-type impurities contained in the embedded semiconductor layer and a p+ layer of the tunnel junction layer can be improved, and favorable current diffusion and carrier injection can be performed.

According to one aspect of the present disclosure, the tunnel junction layer has a stacked structure of an n+ layer and a p+ layer, and the tunnel junction layer is formed with a groove reaching up to at least the p+ layer from a surface of the mesa structure.

According to one aspect of the present disclosure, the groove is formed to reach the embedded semiconductor layer.

According to one aspect of the present disclosure, the groove is formed to reach up to a growth substrate side with respect to a top surface of the columnar semiconductor layer.

According to one aspect of the present disclosure, the groove is formed in a region except for the columnar semiconductor layer, in a plan view.

According to one aspect of the present disclosure, the groove is formed in a dot shape or a linear shape.

According to another aspect of the present disclosure, there is provided a method for manufacturing a semiconductor light-emitting element, the method including: a first growth step of forming, on a growth substrate, a plurality of columnar semiconductor layers and a p-type embedded semiconductor layer; a second growth step of forming, on the embedded semiconductor layer, a tunnel junction layer and an n-type semiconductor layer; a mesa forming step of forming a mesa structure in the embedded semiconductor layer, the tunnel junction layer, and the n-type semiconductor layer to expose the tunnel junction layer from a side surface of the mesa structure; and an activation step of activating a p+ layer included in the tunnel junction layer, after the mesa forming step.

According to one aspect of the present disclosure, the method further includes a groove etching step of forming, by etching, a groove that reaches up to at least the p+ layer from a surface of the mesa structure, after the second growth step and before the activation step.

According to one aspect of the present disclosure, the second growth step includes a groove mask removal step of: forming a mask on a part of the embedded semiconductor layer; growing the tunnel junction layer and the n-type semiconductor layer by selective growth using the mask; and removing the mask to form a groove after the second growth step and before the activation step.

Advantageous Effects of Invention

According to the present disclosure, it is possible to provide a semiconductor light-emitting element and a method for manufacturing a semiconductor light-emitting element that can improve an activation rate of p-type impurities contained in a p-type layer and a p+ layer provided in a tunnel junction layer and perform favorable current diffusion and carrier injection.

DESCRIPTION OF EMBODIMENTS

First Embodiment

Figure 1:
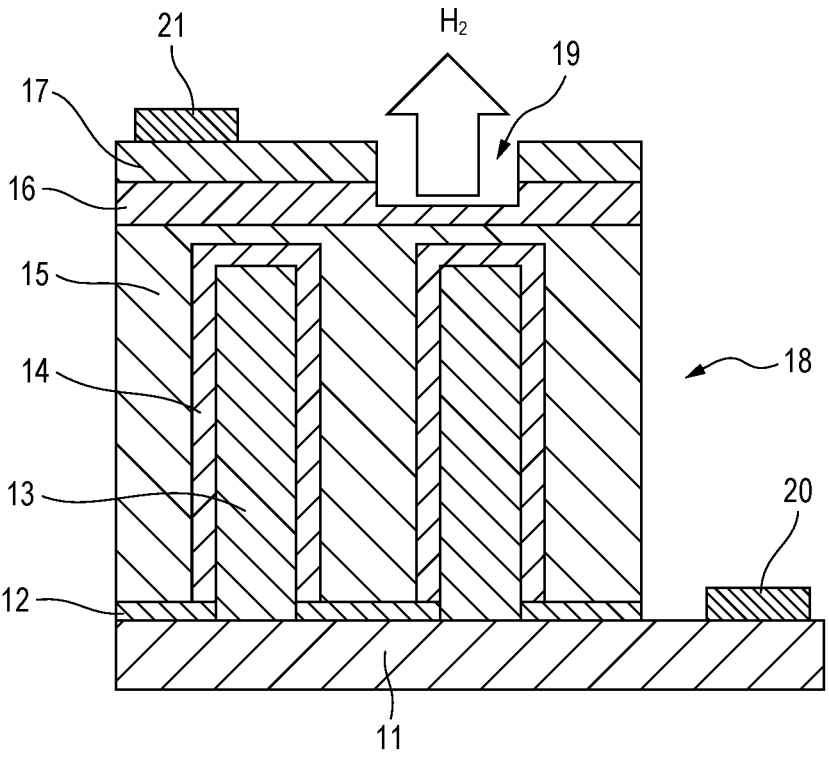
FIG. 1 is a schematic view showing a semiconductor light-emitting element 10 according to a first embodiment.

Hereinafter, embodiments of the present disclosure will be described in detail with reference to the drawings. The same or equivalent components, members, and processes shown in the drawings are denoted by the same reference numerals, and redundant description thereof will be omitted as appropriate. FIG. 1 is a schematic view showing a semiconductor light-emitting element 10 according to a first embodiment.

As shown in FIG. 1, the semiconductor light-emitting element 10 includes a growth substrate 11, a mask 12, a nanowire layer 13, an active layer 14, an embedded semiconductor layer 15, a tunnel junction layer 16, an n-type semiconductor layer 17, a mesa groove 18, a groove 19, a cathode electrode 20, and an anode electrode 21. Here, the nanowire layer 13 and the active layer 14 are selectively grown in a direction perpendicular to the growth substrate 11 and form a columnar shape, and configure a columnar semiconductor layer disclosed herein.

As shown in FIG. 1, in a part of the semiconductor light-emitting element 10, the embedded semiconductor layer 15 is removed from a surface thereof to the growth substrate 11 to form the mesa groove 18 (mesa structure), and a surface of the growth substrate 11 is exposed and the cathode electrode 20 is formed. The anode electrode 21 is formed on the n-type semiconductor layer 17. Here, the mesa structure refers to a structure in which a groove penetrating a plurality of semiconductor layers is formed to surround a predetermined region such that a cross section of a stacked structure of the semiconductor layers is exposed from a side surface.

The growth substrate 11 is a substantially flat plate-shaped member formed of a material supporting crystal growth of a semiconductor material, and the mask 12 is formed on a main surface side. Apart of the growth substrate 11 is exposed and the cathode electrode 20 is formed. In a case where the semiconductor light-emitting element 10 is formed of a nitride-based semiconductor, a GaN substrate is preferably used as the growth substrate 11, and for laser oscillation, a c-plane GaN substrate, on which a resonator plane is easy to be formed by cleavage, may be used. Alternatively, a different substrate such as a c-plane sapphire substrate or a Si substrate that is formed of a material different from the semiconductor material grown as the growth substrate 11 may be used to grow a plurality of semiconductor layers such as a buffer layer and an underlying layer.

The buffer layer is a layer formed between a single crystal substrate and the underlying layer to reduce lattice mismatch in between. In a case where a c-plane sapphire substrate is used as the single crystal substrate, although GaN is preferably used for the buffer layer, AlN, AlGaN, and the like may also be used. The underlying layer is a single crystal semiconductor layer formed on the growth substrate 11 or the buffer layer, and is preferably implemented by a plurality of layers including an n-type semiconductor layer such as an n-type contact layer provided on undoped GaN having a thickness of several μm. The n-type contact layer is a semiconductor layer doped with n-type impurities, and examples thereof include Si-doped n-type $Al_{0.05}GaN_{0.95}$.

The mask 12 is a layer including a dielectric material formed on a surface of the growth substrate 11 or the underlying layer. As a material forming the mask 12, a material that is difficult to grow a crystal of a semiconductor from the mask 12 is selected, and examples thereof include $SiO2$, $SiNx$, and $Al2O3$. The mask 12 is formed with a plurality of openings to be described later, such that a semiconductor layer can be grown from a part of the surface of the growth substrate 11 or the underlying layer exposed from the openings.

The columnar semiconductor layer is a semiconductor layer crystal-grown in the openings provided in the mask 12, and a substantially columnar semiconductor layer stands vertically with respect to a main surface of the growth substrate 11. Such a columnar semiconductor layer can be obtained by setting appropriate growth conditions according to a semiconductor material forming the columnar semiconductor layer and by performing selective growth in which a crystal plane in a specific orientation grows. In the example shown in FIG. 1, the plurality of openings are two-dimensionally and periodically formed in the mask 12, and thus the columnar semiconductor layer is also two-dimensionally and periodically formed on the growth substrate 11.

The nanowire layer 13 is a columnar semiconductor layer selectively grown on the growth substrate 11 or the underlying layer exposed from the openings of the mask 12, and is formed of, for example, GaN doped with n-type impurities. In a case where GaN is used as the nanowire layer 13, the nanowire layer 13 selectively grown on the growth substrate 11 has a substantially hexagonal columnar shape in which six m-planes are formed as facets. In FIG. 1, it appears that the nanowire layer 13 is grown only in regions where the openings are formed. However, in practice, the crystal growth also progresses on the mask 12 by lateral growth, and thus an enlarged hexagonal column is formed around the openings. For example, in a case where the openings are each formed as a circle having a diameter of substantially 150 nm, it is possible to form the nanowire layer 13 having a hexagonal columnar shape and a height of substantially 1 to 2 μm with a hexagonal shape, as a bottom surface, inscribed in a circle having a diameter of substantially 240 nm.

Although GaN is used as the nanowire layer 13 in the present embodiment, GaInN may be used as the nanowire layer 13 in order to reduce misfit dislocations due to lattice mismatch, in a case where an In composition of the active layer 14 is increased in order to increase an emission wavelength. Similarly, in a case where the wavelength of the semiconductor light-emitting element 10 is to be shortened, AlGaN may be used as the nanowire layer 13, or a well layer and a barrier layer of the active layer 14 may be changed to AlGaN having different compositions.

The active layer 14 is a semiconductor layer grown on an outer periphery of the nanowire layer 13, and is, for example, a multiple quantum well active layer in which a GaInN quantum well layer having a thickness of 5 nm and a GaN barrier layer having a thickness of 10 nm are stacked five times. Here, the multiple quantum well active layer is exemplified, and a single quantum well structure or a bulk active layer may be used. The active layer 14 is formed on a side surface and an upper surface of the nanowire layer 13, and thus an area of the active layer 14 can be ensured. As a ratio of In adsorbed into the active layer increases, the emission wavelength of the semiconductor light-emitting element 10 becomes longer, and the emission wavelength can be 480 nm or more, in a case where an In composition ratio is 0.10 or more. In a case where the In composition ratio is 0.12 or more, the emission wavelength can be 500 nm or more. Since the side surface of the nanowire layer 13 is the m-plane, the active layer 14 formed on the side surface is also a nonpolar plane having the m-plane, such that droop characteristics can be improved.

The embedded semiconductor layer 15 is a semiconductor layer grown on an outer periphery of the active layer 14, and is formed of, for example, GaN doped with p-type impurities. The embedded semiconductor layer 15 covers a side surface and an upper surface of the active layer 14, and covers up to the growth substrate 11 or the underlying layer. Accordingly, the nanowire layer 13, the active layer 14, and the embedded semiconductor layer 15 configure a double heterostructure, such that carriers are favorably confined in the active layer 14 and a probability of radiative recombination can be improved. Although FIG. 1 shows an example in which the embedded semiconductor layer 15 includes a single layer, a multilayer structure of a plurality of layers may be used as long as the semiconductor layer is embedded from the surface of the growth substrate 11 to an upper surface of the columnar semiconductor layer.

The tunnel junction layer 16 is a semiconductor layer formed on the embedded semiconductor layer 15, and has a two-layer structure in which, for example, a p+ layer 16p (not shown in FIG. 1) doped with p-type impurities at a high concentration and is in contact with the embedded semiconductor layer 15, and an n+ layer 16n (not shown in FIG. 1) doped with n-type impurities at a high concentration and is formed on the p+ layer 16p, are grown sequentially. The p+ layer 16p is a semiconductor layer doped with p-type impurities at a high concentration, and for example, GaN having a thickness of 5 nm and an Mg concentration of $2\times1020$ cm-3 can be used. Regarding the n+ layer 16n, for example, GaN having a thickness of 10 nm and a Si concentration of $2\times1020$ cm-3 can be used. The p+ layer and the n+ layer form a tunnel junction, and thus two layers including the p+ layer 16p and the n+ layer 16n form the tunnel junction layer 16 disclosed herein.

The n-type semiconductor layer 17 is an n-type semiconductor layer formed on the tunnel junction layer 16, and the anode electrode 21 is formed on a part of a surface of the n-type semiconductor layer 17. The n-type semiconductor layer 17 may be a single layer or a multilayer structure of a plurality of layers. A material of the n-type semiconductor layer 17 is not limited, and for example, n-type GaN and n-type AlGaN can be used. Since the anode electrode 21 is formed on the n-type semiconductor layer 17, a contact layer having a high n-type impurity concentration is preferably formed on an outermost surface of the n-type semiconductor layer 17.

The mesa groove 18 is a groove penetrating each of the semiconductor layers from the n-type semiconductor layer 17 up to the growth substrate 11 or up to the underlying layer, and divides a light-emitting region of the semiconductor light-emitting element 10 to form a mesa structure. Outer peripheries of the n-type semiconductor layer 17, of the tunnel junction layer 16 (n+ layer 16n, p+ layer 16p), and of the embedded semiconductor layer 15 are exposed from a side surface of the mesa groove 18. Accordingly, the tunnel junction layer 16 extends to a side surface of the mesa structure defined by the mesa groove 18. Here, the exposure of the semiconductor layers at the side surface of the mesa structure means that the outer peripheries of the semiconductor layers extend to the side surface of the mesa structure in a case where the mesa groove 18 is formed, which includes forming a passivation film and other structures in the mesa groove 18 in a post-processing. In the mesa groove 18, an element isolation groove is further formed to separate the semiconductor light-emitting elements 10 individually.

Figure 2A:
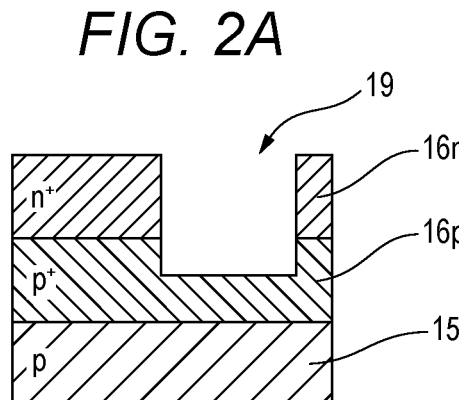
FIG. 2A is an enlarged view schematically showing a part of a structure example of a groove 19 formed in the semiconductor light-emitting element 10, which shows an example in which the groove 19 is formed up to a p+ layer 16p.
Figure 2B:
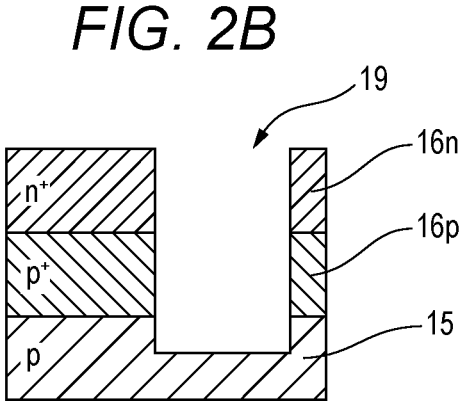
FIG. 2B is an enlarged view schematically showing a part of a structure example of a groove 19 formed in the semiconductor light-emitting element 10, which shows an example in which the groove 19 is formed up to an embedded semiconductor layer 15.
Figure 2C:
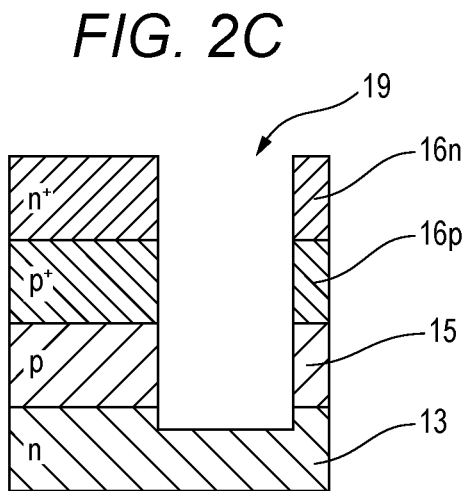
FIG. 2C is an enlarged view schematically showing a part of a structure example of a groove 19 formed in the semiconductor light-emitting element 10, which shows an example in which the groove 19 is formed up to a nanowire layer 13.

The groove 19 is a groove reaching up to at least the p+ layer 16p of the tunnel junction layer 16 from the surface of the n-type semiconductor layer 17 of the mesa structure. FIG. 2A is an enlarged view schematically showing a part of a structure example of a groove 19 formed in the semiconductor light-emitting element 10, which shows an example in which the groove 19 is formed up to a p+ layer 16p. FIG. 2B is an enlarged view schematically showing a part of a structure example of a groove 19 formed in the semiconductor light-emitting element 10, which shows an example in which the groove 19 is formed up to an embedded semiconductor layer 15. FIG. 2C is an enlarged view schematically showing a part of a structure example of a groove 19 formed in the semiconductor light-emitting element 10, which shows an example in which the groove 19 is formed up to a nanowire layer 13.

As shown in FIG. 2A, in a case where the groove 19 is formed up to halfway of the p+ layer 16p, the p+ layer 16p is exposed at a bottom portion and a side portion of the groove 19. In this structure, an exposed area of the p+ layer 16p in the groove 19 is large, and thus hydrogen atoms adsorbed into the p+ layer 16p are easily desorbed from the groove 19 in an activation step to be described later.

As shown in FIG. 2B, in a case where the groove 19 reaches up to the embedded semiconductor layer 15, the p+ layer 16p is exposed at the side portion of the groove 19, and the embedded semiconductor layer 15 is exposed at the bottom portion and the side portion of the groove 19. In this structure, since the p+ layer 16p is exposed at the side portion of groove 19, hydrogen atoms adsorbed into the p+ layer 16p can be desorbed from the groove 19 in the activation step. Further, since the embedded semiconductor layer 15 is exposed at the bottom portion and the side portion of the groove 19, hydrogen atoms adsorbed into the embedded semiconductor layer 15 can be desorbed from the groove 19 in the activation step.

As shown in FIG. 2C, the groove 19 may be formed deeper than a top surface of the columnar semiconductor layer up to a growth substrate 11 side, and may reach up to a part of the nanowire layer 13. Alternatively, the groove 19 may be formed deeper than the top surface of the nanowire layer 13, in positions avoiding the nanowire layer 13. In this structure, the p+ layer 16p and the embedded semiconductor layer 15 are exposed at the side portion of the groove 19, and adsorbed hydrogen atoms can be desorbed from the groove 19 in the activation step.

The cathode electrode 20 is an electrode formed in a region where the growth substrate 11 or the underlying layer is exposed, and is implemented by a stacked structure of a metal material and a pad electrode that is in ohmic contact with the exposed semiconductor layer. The anode electrode 21 is an electrode formed on a part of the n-type semiconductor layer 17, and is implemented by a stacked structure of a metal material and a pad electrode that is in ohmic contact with the outermost surface of the n-type semiconductor layer 17. Although not shown in FIG. 1, a known structure such as covering the surface of the semiconductor light-emitting element 10 with a passivation film may be applied as necessary. Alternatively, a transparent electrode obtained by extending the anode electrode 21 on the entire n-type semiconductor layer 17 may be provided.

Figure 3A:
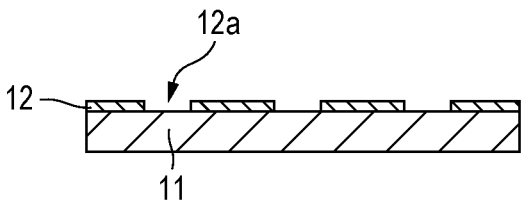
FIG. 3A is a schematic view showing a first growth step in a method for manufacturing the semiconductor light-emitting element 10, which shows a mask forming step.
Figure 3B:
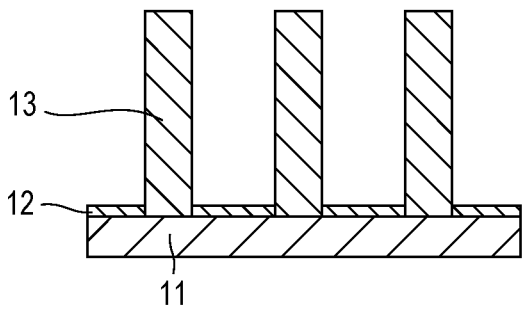
FIG. 3B is a schematic view showing a first growth step in a method for manufacturing the semiconductor light-emitting element 10, which shows a nanowire growth step.
Figure 3C:
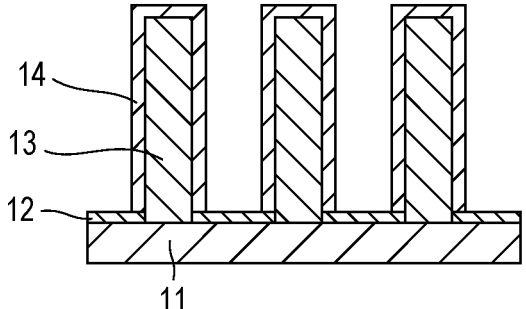
FIG. 3C is a schematic view showing a first growth step in a method for manufacturing the semiconductor light-emitting element 10, which shows an active layer growth step.
Figure 3D:
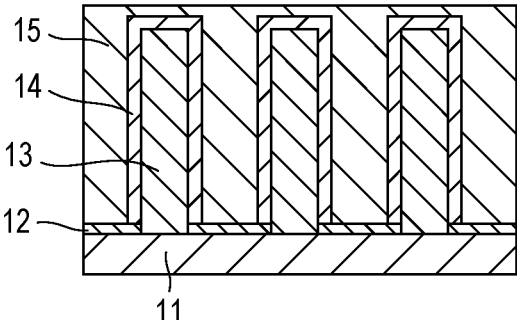
FIG. 3D is a schematic view showing a first growth step in a method for manufacturing the semiconductor light-emitting element 10, which shows an embedded semiconductor layer growth step.
Figure 4A:
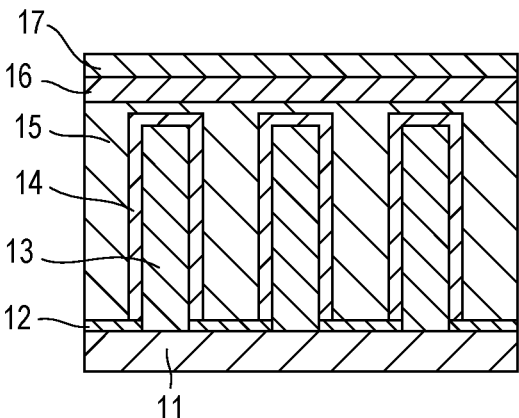
FIG. 4A is a schematic view showing a method for manufacturing the semiconductor light-emitting element 10 according to the first embodiment, which shows a second growth step.
Figure 4B:
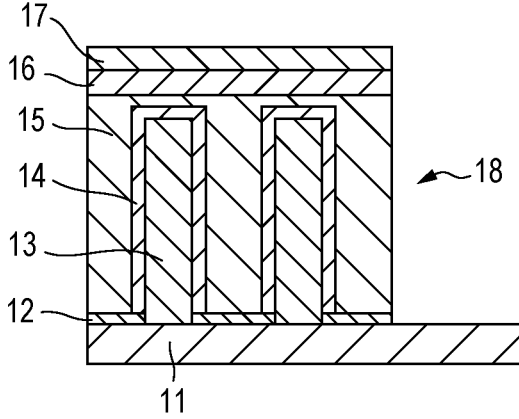
FIG. 4B is a schematic view showing a method for manufacturing the semiconductor light-emitting element 10 according to the first embodiment, which shows a mesa forming step.
Figure 4C:
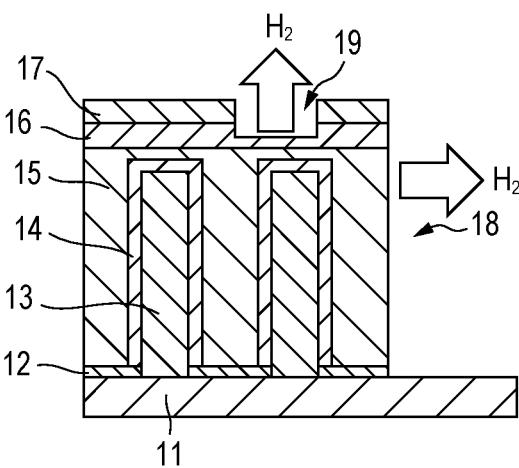
FIG. 4C is a schematic view showing a method for manufacturing the semiconductor light-emitting element 10 according to the first embodiment, which shows a groove etching step and an activation step.
Figure 4D:
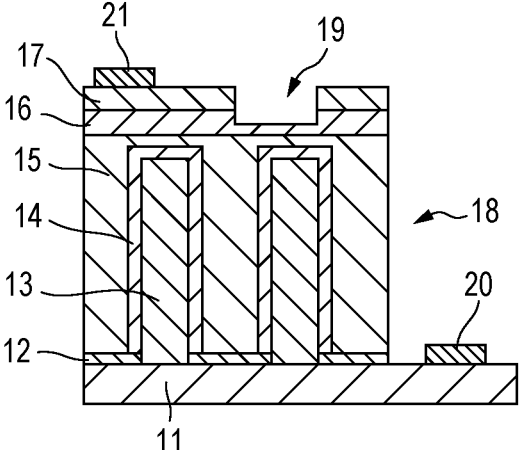
FIG. 4D is a schematic view showing a method for manufacturing the semiconductor light-emitting element 10 according to the first embodiment, which shows an electrode forming step.

FIG. 3A is a schematic view showing a first growth step in a method for manufacturing the semiconductor light-emitting element 10, which shows a mask forming step. FIG. 3B is a schematic view showing a first growth step in a method for manufacturing the semiconductor light-emitting element 10, which shows a nanowire growth step. FIG. 3C is a schematic view showing a first growth step in a method for manufacturing the semiconductor light-emitting element 10, which shows an active layer growth step. FIG. 3D is a schematic view showing a first growth step in a method for manufacturing the semiconductor light-emitting element 10, which shows an embedded semiconductor layer growth step. FIG. 4A is a schematic view showing a method for manufacturing the semiconductor light-emitting element 10 according to the first embodiment, which shows a second growth step. FIG. 4B is a schematic view showing a method for manufacturing the semiconductor light-emitting element 10 according to the first embodiment, which shows a mesa forming step. FIG. 4C is a schematic view showing a method for manufacturing the semiconductor light-emitting element 10 according to the first embodiment, which shows a groove etching step and an activation step. FIG. 4D is a schematic view showing a method for manufacturing the semiconductor light-emitting element 10 according to the first embodiment, which shows an electrode forming step.

First, in the mask forming step shown in FIG. 3A, the mask 12 formed of SiO2 is deposited on the growth substrate 11 formed of n-type GaN to have a film thickness of substantially 30 nm by a sputtering method, and openings 12a each having a diameter of substantially 150 nm are formed using a fine pattern forming method such as nano-imprinting lithography. In a case where a different substrate such as sapphire is used as the growth substrate 11, a buffer layer, an underlying layer, and an n-type semiconductor layer may be formed on the sapphire substrate, and a surface of the n-type semiconductor layer may be used as the surface of the growth substrate 11. Growth conditions of the buffer layer are, for example: trimethylalminium (TMA), trimethylgallium (TMG), and ammonia are used as source gases; a growth temperature is 1100° C.; a V/III ratio is 1000; and the pressure is 10 hPa using hydrogen as a carrier gas. Growth conditions of the underlying layer and the n-type semiconductor layer are, for example: a growth temperature of 1050° C.; a V/III ratio of 1000; and a pressure of 500 hPa using hydrogen as a carrier gas.

Next, in the nanowire growth step shown in FIG. 3B, the nanowire layer 13 formed of GaN is grown, by selective growth by MOCVD, on the growth substrate 11 exposed from the openings 12a. Growth conditions of the nanowire layer 13 are, for example: TMG and ammonia are used as source gases; a growth temperature is 1050° C.; a V/III ratio is 10; and the pressure is 100 hPa using hydrogen as a carrier gas.

Next, in the active layer growth step shown in C, the active layer 14, in which a GaInN quantum well layer having a thickness of 5 nm and a GaN barrier layer having a thickness of 10 nm are stacked five times, is grown on the side surface and the upper surface of the nanowire layer 13 using MOCVD. Growth conditions of the active layer 14 are, for example: a growth temperature is 800° C.; a V/III ratio is 3000; nitrogen is used as a carrier gas; the pressure is 1000 hPa; and TMG, trimethylindium (TMI), and ammonia are used as source gases.

Next, in the embedded semiconductor layer growth step shown in FIG. 3D, the embedded semiconductor layer 15 formed of GaN doped with p-type impurities is grown, and the outer periphery and the upper surface of the columnar semiconductor layer including the nanowire layer 13 and the active layer 14 are filled with the embedded semiconductor layer 15. Growth conditions of the embedded semiconductor layer 15 are, for example: a growth temperature is 950° C.; a V/III ratio is 1000; hydrogen is used as a carrier gas; the pressure is 300 hPa; and TMG, bis(cyclopentadienyl)magnesium (Cp2Mg), and ammonia are used as source gases. To increase a thickness of the embedded semiconductor layer 15, the growth conditions of the embedded semiconductor layer 15 are preferably conditions under which c-plane growth, which is growth in a vertical direction, is promoted.

As described above, the embedded semiconductor layer 15 needs to grow on the mask 12 provided between columnar semiconductor layers, and a gap may be generated at a lower portion of the columnar semiconductor layers when the embedded semiconductor layer 15 is grown. Accordingly, in the growth of the embedded semiconductor layer 15, the embedded semiconductor layer 15 preferably grows using TMG, silane, and ammonia as a source gas at a low temperature and a low V/III ratio in which m-plane growth, which is lateral growth, is promoted in an initial stage. Examples of the low temperature and low V/III ratio include a V/III ratio of 100 or less at 800° C. or less and a pressure of 200 hPa using hydrogen as a carrier gas. After the mask 12 is filled without gaps at the lower portion of the columnar semiconductor layers by the lateral growth of the embedded semiconductor layer 15, the growth is preferably performed at a high temperature and a high V/III ratio that promotes the c-plane growth that is vertical growth. Examples of the high temperature and high V/III ratio include a V/III ratio of 2000 or more at 1000° C. or more, and a pressure of 500 hPa using hydrogen as a carrier gas. The steps from the mask forming step of FIG. 3A to the embedded semiconductor layer growth step of FIG. 3D correspond to the first growth step of the present disclosure.

Next, in the second growth step shown in FIG. 4A, the p+ layer 16p and the n+ layer 16n of the tunnel junction layer 16 and the n-type semiconductor layer 17 are grown on the embedded semiconductor layer 15. Growth conditions of the tunnel junction layer 16 are, for example: a growth temperature of 800° C.; a V/III ratio of 3000; and a pressure of 500 hPa using nitrogen as a carrier gas. Examples of the p+ layer 16p include GaN having a thickness of 5 nm and a Mg concentration of 2×1020 cm-3, and examples of the n+ layer 16n include GaN having a thickness of 10 nm and a Si concentration of 2×1020 cm-3.

Next, in the mesa forming step shown in FIG. 4B, a part of the tunnel junction layer 16 and a part of the embedded semiconductor layer 15 are removed from the n-type semiconductor layer 17 by selective dry etching to expose the upper surface of the growth substrate 11, to form the mesa groove 18. The mesa groove 18 is formed as described above to define a region surrounded by the mesa groove 18 as a light-emitting region of the semiconductor light-emitting element 10.

Next, in the groove etching step shown in FIG. 4C, the groove 19 that reaches up to at least the p+ layer 16p of the tunnel junction layer 16 from the n-type semiconductor layer 17 is formed by selective dry etching. After the groove 19 is formed, an activation step is performed, and an activation treatment is performed in which hydrogen is adsorbed from the embedded semiconductor layer 15 and the p+ layer 16$p$ that reach up to the side surface of the mesa structure and are exposed. At the same time, hydrogen is also desorbed from the p+ layer 16$p$ exposed in the groove 19 to promote the activation treatment. Here, a method for the activation treatment is not limited, and a heat treatment (annealing) at 600° C. in the atmosphere is exemplified. Although annealing in the atmosphere is shown, the heat treatment in an atmosphere in which atomic hydrogen is not present and the embedded semiconductor layer 15 and the tunnel junction layer 16 can be activated may be performed.

Next, in the electrode forming step shown in FIG. 4D, the cathode electrode 20 is formed on the surface of the growth substrate 11, and the anode electrode 21 is formed on the n-type semiconductor layer 17. When necessary, annealing, forming of a passivation film, and element division are performed after the forming of the electrodes to obtain the semiconductor light-emitting element 10.

In the semiconductor light-emitting element 10 according to the present embodiment, in a case where a voltage is applied between the cathode electrode 20 and the anode electrode 21, a current flows through the n-type semiconductor layer 17, the tunnel junction layer 16, the embedded semiconductor layer 15, the active layer 14, the nanowire layer 13, and the growth substrate 11 in this order, and light is generated in the active layer 14 due to radiative recombination. Light emitted from the active layer 14 is extracted to the outside of the semiconductor light-emitting element 10.

Current injection by a tunnel current through the tunnel junction layer 16 has a small resistance and can be favorably performed. The n-type semiconductor layer 17 easily diffuses a current, and thus the current can be diffused in an entire region of the mesa structure and is injected from the entire tunnel junction layer 16. Accordingly, a high current density in the semiconductor light-emitting element 10 is achieved, and the external quantum efficiency can be improved.

Since the side surface of the nanowire layer 13 is an m-plane formed by selective growth, the active layer 14 and the embedded semiconductor layer 15 formed on the outer periphery of the nanowire layer 13 are also in contact with each other on the m-plane. Since the m-plane is a nonpolar plane and is not polarized, the active layer 14 has a high luminous efficiency. Since all side surfaces of a hexagonal column are m-planes, the luminous efficiency of the semiconductor light-emitting element 10 can be improved. Further, since the film thickness of the active layer can be increased, the volume of the active layer 14 can be increased to substantially 3 to 10 times as large as that of a semiconductor light-emitting element in the related art, and the injected carrier density can be reduced to significantly reduce the efficiency droop.

As described above, in the semiconductor light-emitting element 10 according to the present embodiment, the tunnel junction layer 16 extends up to the side surface of the mesa structure, and the groove 19 is formed up to at least the p+ layer 16$p$. Accordingly, hydrogen atoms can be desorbed from the embedded semiconductor layer 15 and the tunnel junction layer 16 exposed at the side surface of the mesa structure in the activation step, an activation rate of p-type impurities contained in the embedded semiconductor layer 15 and the p+ layer 16$p$ can be increased, and favorable current diffusion and carrier injection can be performed.

After the second growth step, the groove etching step of forming the groove 19 by etching is performed, and the groove 19 reaching up to at least the p+ layer 16$p$ is formed. Thereafter, by performing the activation step, hydrogen atoms can be desorbed from the p+ layer 16$p$ exposed at the side surface of the groove 19 in the activation step, the activation rate of p-type impurities contained in the p+ layer 16$p$ not only in a vicinity of the outer periphery of the mesa structure but also in an internal region can be increased, and favorable current diffusion and carrier injection can be performed.

Second Embodiment

Figure 5A:
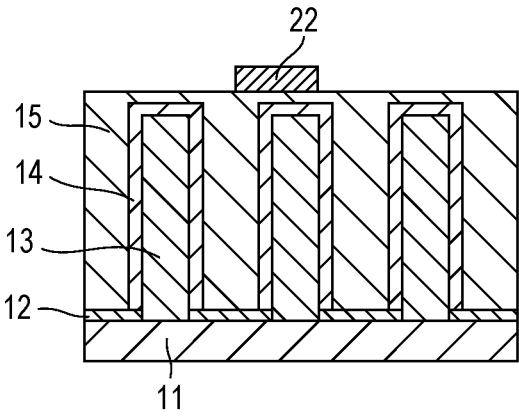
FIG. 5A is a schematic view showing a method for manufacturing the semiconductor light-emitting element 10 according to a second embodiment, which shows a mask forming step.
Figure 5B:
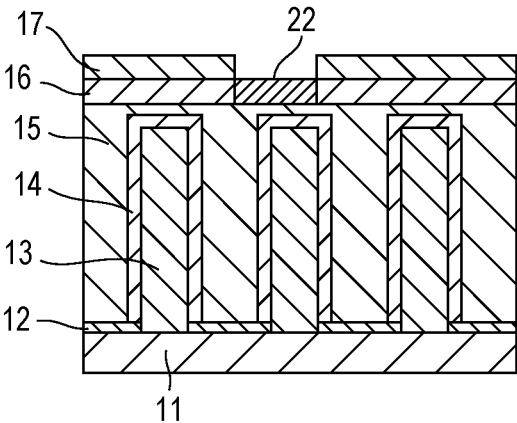
FIG. 5B is a schematic view showing a method for manufacturing the semiconductor light-emitting element 10 according to a second embodiment, which shows a second growth step.
Figure 5C:
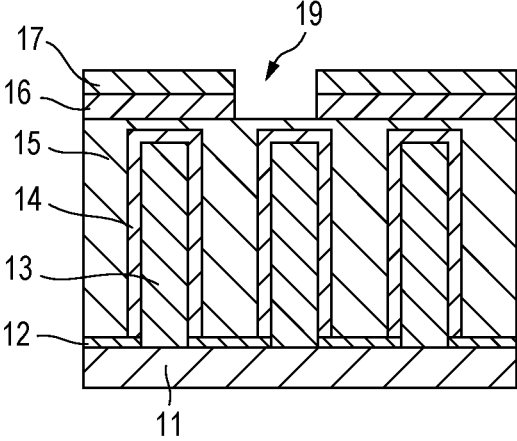
FIG. 5C is a schematic view showing a method for manufacturing the semiconductor light-emitting element 10 according to a second embodiment, which shows a groove mask removal step.
Figure 5D:
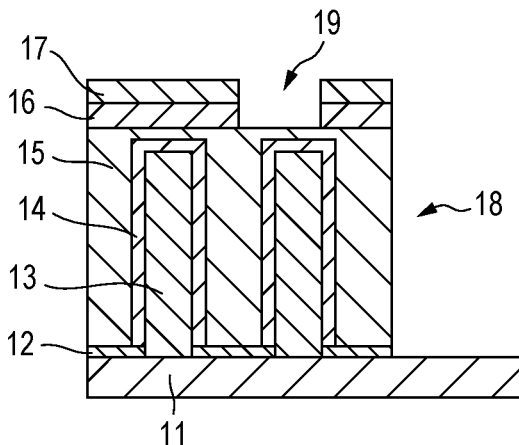
FIG. 5D is a schematic view showing a method for manufacturing the semiconductor light-emitting element 10 according to a second embodiment, which shows a mesa forming step and an activation step.
Figure 5E:
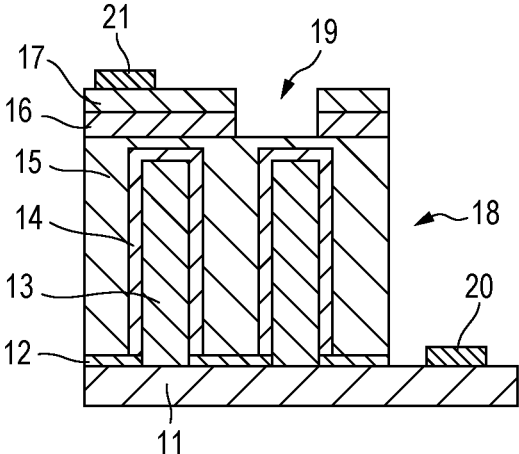
FIG. 5E is a schematic view showing a method for manufacturing the semiconductor light-emitting element 10 according to a second embodiment, which shows an electrode forming step.

Next, a second embodiment of the present disclosure will be described with reference to FIGS. 5A to 5E. Description of contents overlapping with the first embodiment will be omitted. FIG. 5A is a schematic view showing a method for manufacturing the semiconductor light-emitting element 10 according to a second embodiment, which shows a mask forming step. FIG. 5B is a schematic view showing a method for manufacturing the semiconductor light-emitting element 10 according to a second embodiment, which shows a second growth step. FIG. 5C is a schematic view showing a method for manufacturing the semiconductor light-emitting element 10 according to a second embodiment, which shows a groove mask removal step. FIG. 5D is a schematic view showing a method for manufacturing the semiconductor light-emitting element 10 according to a second embodiment, which shows a mesa forming step and an activation step. FIG. 5E is a schematic view showing a method for manufacturing the semiconductor light-emitting element 10 according to a second embodiment, which shows an electrode forming step. The present embodiment differs from the first embodiment in that the second growth step is performed by selective growth using a mask after the first growth step shown in FIGS. 3A to 3D.

In the mask forming step shown in FIG. 5A, a mask 22 is formed on a part of the embedded semiconductor layer 15 after the embedded semiconductor layer growth step shown in FIG. 3D. As a material forming the mask 22, a dielectric material that is difficult to grow a crystal of the tunnel junction layer 16 from the top of the mask 22 is selected, and examples thereof include SiO2, SiNx, and Al2O3. A region in which the mask 22 is formed is a region in which the groove 19 is formed, and by forming the mask 22 in a desired position and shape, a pattern of the groove 19 can be formed in consideration of a positional relationship thereof with the nanowire layer 13 as described later.

Next, in the second growth step shown in FIG. 5B, the p+ layer 16$p$, the n+ layer 16$n$, and the n-type semiconductor layer 17 of the tunnel junction layer 16 are grown on the embedded semiconductor layer 15 by selective growth using the mask 22. At this time, the p+ layer 16$p$ and the n+ layer 16$n$ of the tunnel junction layer 16 are not grown on the mask 22, and the mask 22 remains at the bottom portion of the groove 19.

Next, in the groove mask removal step shown in FIG. 5C, the mask 22 is removed by etching to form the groove 19 and expose the surface of the embedded semiconductor layer 15 at the bottom portion of the groove 19. At this time, the p+ layer 16$p$ of the tunnel junction layer 16 is exposed at the side portion of the groove 19. The mask 22 can be removed by wet etching in which only the material of the mask 22 is removed without etching semiconductor materials forming the n-type semiconductor layer 17 and the tunnel junction layer 16.

Next, in the mesa forming step shown in FIG. 5D, a part of the tunnel junction layer 16 and a part of the embedded semiconductor layer 15 are removed from the n-type semiconductor layer 17 by selective dry etching to expose the upper surface of the growth substrate 11 and form the mesa groove 18. The mesa groove 18 is formed as described above to define a region surrounded by the mesa groove 18 as a light-emitting region of the semiconductor light-emitting element 10. After the groove 19 and the mesa groove 18 are formed, an activation step is performed, in which hydrogen is adsorbed from the embedded semiconductor layer 15 and the p+ layer 16$p$ that reach up to the side surface of the mesa structure to be are exposed. At the same time, hydrogen is also desorbed from the embedded semiconductor layer 15 and the p+ layer 16$p$ exposed in the groove 19 to promote the activation treatment.

Next, in the electrode forming step shown in FIG. 5E, the cathode electrode 20 is formed on the surface of the growth substrate 11, and the anode electrode 21 is formed on the n-type semiconductor layer 17. When necessary, annealing, forming of a passivation film, and element division are performed after the forming of the electrodes to obtain the semiconductor light-emitting element 10.

Also in the present embodiment, the groove 19 is formed in the second growth step by selective growth using the mask 22 and the mask removal step, and the groove 19 reaches up to at least the p+ layer 16$p$. Thereafter, by performing the activation step, hydrogen atoms can be desorbed from the p+ layer 16$p$ exposed at the side surface of the groove 19 in the activation step, the activation rate of p-type impurities contained in the p+ layer 16$p$ not only in a vicinity of the outer periphery of the mesa structure but also in an internal region can be increased, and favorable current diffusion and carrier injection can be performed.

Third Embodiment

Figure 6A:
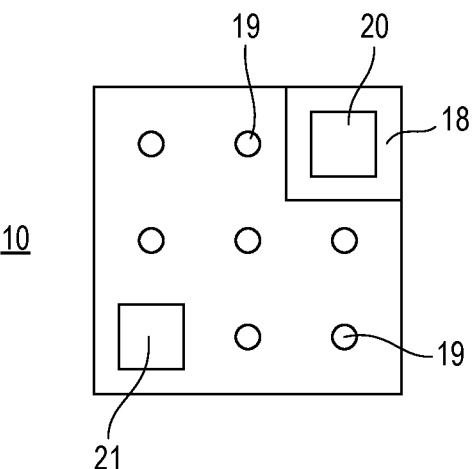
FIG. 6A is a plan view schematically showing a forming pattern of the groove 19 according to a third embodiment, which shows a circular dot shape.
Figure 6B:
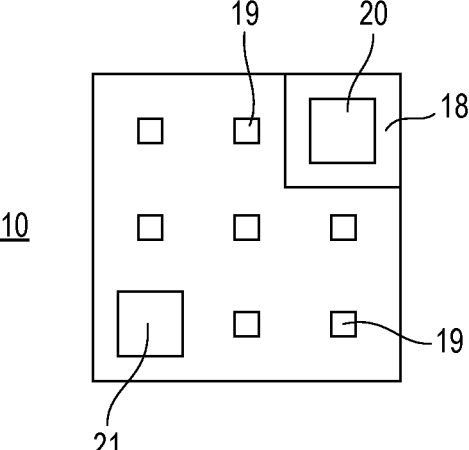
FIG. 6B is a plan view schematically showing a forming pattern of the groove 19 according to a third embodiment, which shows a polygonal dot shape.
Figure 6C:
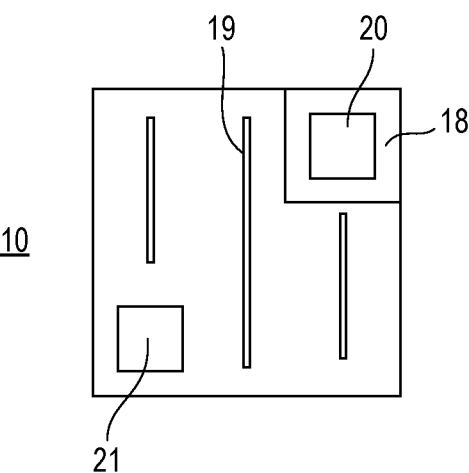
FIG. 6C is a plan view schematically showing a forming pattern of the groove 19 according to a third embodiment, which shows a linear low-density arrangement.
Figure 6D:
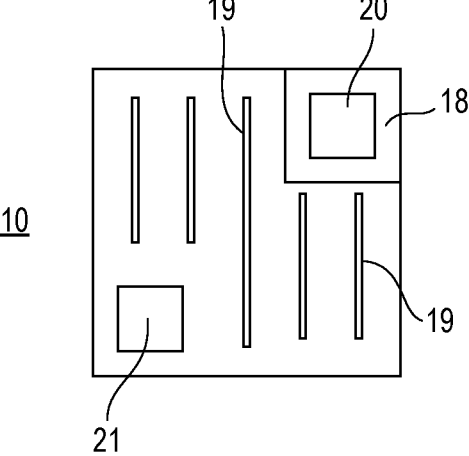
FIG. 6D is a plan view schematically showing a forming pattern of the groove 19 according to a third embodiment, which shows a linear high-density arrangement.

Next, a third embodiment of the present disclosure will be described with reference to FIGS. 6A to 6D. Description of contents overlapping with the first embodiment will be omitted. FIG. 6A is a plan view schematically showing a forming pattern of the groove 19 according to a third embodiment, which shows a circular dot shape. FIG. 6B is a plan view schematically showing a forming pattern of the groove 19 according to a third embodiment, which shows a polygonal dot shape. FIG. 6C is a plan view schematically showing a forming pattern of the groove 19 according to a third embodiment, which shows a linear low-density arrangement. FIG. 6D is a plan view schematically showing a forming pattern of the groove 19 according to a third embodiment, which shows a linear high-density arrangement.

In the example shown in FIGS. 6A to 6D, the mesa structure defined by the mesa groove 18 is assumed to have a rectangular shape of 300 μm×300 μm. A depth at which the groove 19 is formed may be any of the examples shown in FIGS. 2A to 2C.

In the example shown in FIG. 6A, the groove 19 is formed in a circular dot shape, the cathode electrode 20 and the anode electrode 21 are formed diagonally in three rows and three columns at an interval of 100 μm, and the groove 19 is arranged in the remaining seven positions. In the arrangement example, in a case where the groove 19 has a diameter of 20 μm, a total area of the groove 19 is substantially 2200 μm2, and an area ratio of the groove 19 to a chip area is substantially 2.44%. As another example, there is a pattern in which the cathode electrodes 20 and the anode electrodes 21 are formed diagonally in four rows and four columns at an interval of 50 μm, and the groove 19 is arranged in the remaining 14 positions. In the arrangement example, in a case where the groove 19 has a diameter of 5 μm, the total area of the groove 19 is substantially 274 μm2, and the area ratio of the groove 19 to the chip area is substantially 0.73%.

In the example shown in FIG. 6B, the groove 19 is formed in a square dot shape, the cathode electrode 20 and the anode electrode 21 are formed diagonally in three rows and three columns at an interval of 100 μm, and the groove 19 is arranged in the remaining seven positions. In the arrangement example, in a case where one side of the groove 19 is 20 μm, the total area of the groove 19 is 2800 μm2, and the area ratio of the groove 19 to the chip area is substantially 3.10%. As another example, there is a pattern in which the cathode electrodes 20 and the anode electrodes 21 are formed diagonally in four rows and four columns at an interval of 50 μm, and the groove 19 is arranged in the remaining 14 positions. In the arrangement example, in a case where one side of the groove 19 is 5 μm, the total area of the groove 19 is substantially 350 μm2, and the area ratio of the groove 19 to the chip area is substantially 0.39%.

The example shown in FIG. 6C is a pattern in which three grooves 19 are formed in a stripe shape at an interval of 100 μm in parallel to one side wall of the mesa structure. In the arrangement example, in a case where a width of the stripe is 5 μm, a length of a central stripe is 250 μm, and lengths of the other stripes are each 150 μm, the total area of the grooves 19 is 2750 μm2, and the area ratio of the grooves 19 to the chip area is substantially 3.06%.

The example shown in FIG. 6D shows a pattern in which five grooves 19 are formed in a stripe shape at an interval of 50 μm in parallel to one side wall of the mesa structure. In the arrangement example, in a case where the width of the stripe is 5 μm, the length of the central stripe is 250 μm, and lengths of the other stripes are each 150 μm, the total area of the grooves 19 is 4250 μm2, and the area ratio of the grooves 19 to the chip area is substantially 4.72%.

In any of the examples shown in FIG. 6A to 6D, the area ratio of the groove 19 to the chip area is less than 5%. In a case where a current is injected from the tunnel junction layer 16 into the embedded semiconductor layer 15 over 95% or more of the area, the current can be favorably and uniformly injected into the semiconductor light-emitting element 10. Since the interval between adjacent grooves 19 is set at substantially 50 to 100 μm, an area of the p+ layer 16$p$ that can desorb hydrogen from the groove 19 can be ensured, and the p+ layer 16$p$ can be activated over an entire surface. Further, time required for the activation treatment can be shortened.

Fourth Embodiment

Figure 7A:
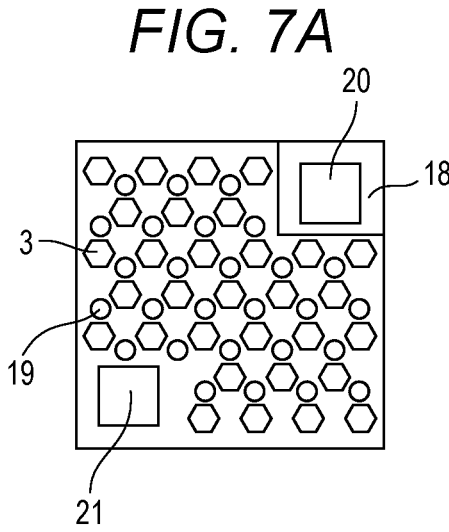
FIG. 7A is a plan view schematically showing a forming pattern of the groove 19 and the nanowire layer 13 according to a fourth embodiment, which shows an example in which the groove 19 having a circular dot shape is arranged among columnar semiconductors.
Figure 7B:
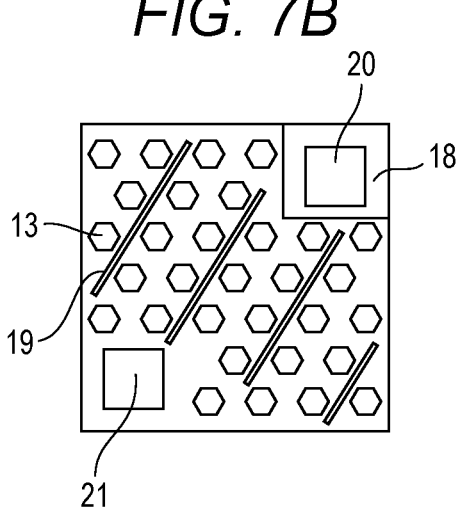
FIG. 7B is a plan view schematically showing a forming pattern of the groove 19 and the nanowire layer 13 according to a fourth embodiment, which shows an example in which the groove 19 having a linear shape is arranged along a direction of connecting electrodes.
Figure 7C:
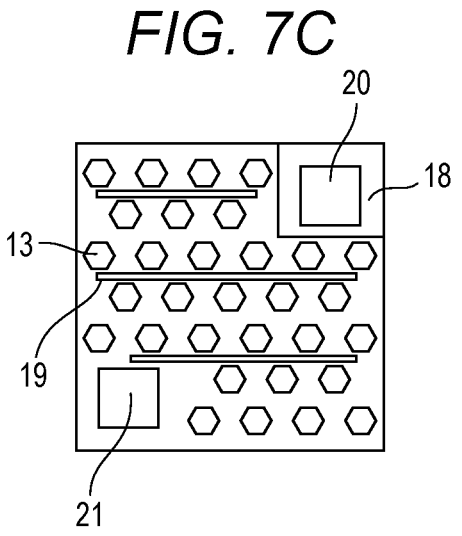
FIG. 7C is a plan view schematically showing a forming pattern of the groove 19 and the nanowire layer 13 according to a fourth embodiment, which shows an example in which the groove 19 having a linear shape is arranged in a direction of crossing the electrodes.

Next, a fourth embodiment of the present disclosure will be described with reference to FIGS. 7A to 7C. Description of contents overlapping with the first embodiment will be omitted. FIG. 7A is a plan view schematically showing a forming pattern of the groove 19 and the nanowire layer 13 according to a fourth embodiment, which shows an example in which the groove 19 having a circular dot shape is arranged among columnar semiconductors. FIG. 7B is a plan view schematically showing a forming pattern of the groove 19 and the nanowire layer 13 according to a fourth embodiment, which shows an example in which the groove 19 having a linear shape is arranged along a direction of connecting electrodes. FIG. 7C is a plan view schematically showing a forming pattern of the groove 19 and the nanowire layer 13 according to a fourth embodiment, which shows an example in which the groove 19 having a linear shape is arranged in a direction of crossing the electrodes.

In the present embodiment, the groove 19 is formed in a region avoiding the nanowire layer 13, in a plan view. The depth at which the groove 19 is formed may be any of the examples shown in FIGS. 2A to 2C, and particularly, in a case where the groove 19 is formed up to a position deeper than the top surface of the nanowire layer 13 (columnar semiconductor layer) as shown in FIG. 2C, the active layer 14 is preferably not removed by the groove 19.

In the example shown in FIG. 7A, the groove 19 is formed in a circular dot shape, and the groove 19 is arranged in the center of the nanowire layer 13 (columnar semiconductor layer) arranged in a triangular lattice shape. In the arrangement example, since the groove 19 can be uniformly formed in substantially an entire surface of the chip region, the p+ layer 16$p$ can be uniformly activated on substantially the entire surface of the chip region.

In the example shown in FIG. 7B, the groove 19 is formed in a linear shape, and the groove 19 is arranged among the nanowire layers 13 along a direction of connecting the anode electrode 21 and the cathode electrode 20, in the arrangement of the nanowire layers 13 arranged in a triangular lattice shape. In the arrangement example, the activation rate of the p+ layer 16$p$ can be increased along a path of a current flowing from the anode electrode 21 toward the cathode electrode 20, and current injection can be further favorably performed.

In the example shown in FIG. 7C, the groove 19 is formed in a linear shape, and the groove 19 is arranged among the nanowire layers 13 in parallel to one side wall of the mesa structure. In the arrangement example, since the groove 19 can be formed from one side of the chip region to the other opposite side, the activation rate of the p+ layer 16$p$ can be increased over substantially the entire surface of the chip region.

Fifth Embodiment

Next, a fifth embodiment of the present disclosure will be described. Description of contents overlapping with the first embodiment will be omitted. In FIGS. 6C and 6D and FIGS. 7B and 7C, the linear groove 19 is shown, and a curved shape may be used. In particular, in a case where a branch electrode for current diffusion branches as a part of the anode electrode 21, the groove 19 may be formed along the branch electrode.

The present disclosure is not limited to the embodiments described above, and various modifications can be made within the scope of the claims. Embodiments obtained by appropriately combining technical techniques disclosed in different embodiments are also included in the technical scope of the present disclosure.

The present application is based on a Japanese patent application (JP2021-089283A) filed on May 27, 2021, and contents thereof are incorporated herein by reference.

INDUSTRIAL APPLICABILITY

According to the present disclosure, it is possible to provide a semiconductor light-emitting element and a method for manufacturing a semiconductor light-emitting element that can improve an activation rate of p-type impurities contained in a p-type layer and a p+ layer provided in a tunnel junction layer and perform favorable current diffusion and carrier injection.

REFERENCE SIGNS LIST

10 . . . semiconductor light-emitting element
11 . . . growth substrate
12 . . . mask
12$a$ . . . opening
13 . . . nanowire layer
14 . . . active layer
15 . . . embedded semiconductor layer
16 . . . tunnel junction layer
17 . . . n-type semiconductor layer
18 . . . mesa groove
19 . . . groove
20 . . . cathode electrode
21 . . . anode electrode
22 . . . mask

The invention claimed is:

1. A semiconductor light-emitting element comprising:
a growth substrate;
a plurality of columnar semiconductor layers formed on the growth substrate;
a p-type embedded semiconductor layer that is in contact with side surfaces of the plurality of columnar semiconductor layers and that covers the columnar semiconductor layers;
a tunnel junction layer formed on the embedded semiconductor layer; and
an n-type semiconductor layer formed on the tunnel junction layer,
wherein a mesa structure is formed in the embedded semiconductor layer, the tunnel junction layer, and the n-type semiconductor layer, and
the tunnel junction layer is formed to extend up to a side surface of the mesa structure, and
the tunnel junction layer is formed with a groove reaching up from a surface of the mesa structure.

2. The semiconductor light-emitting element according to claim 1, wherein the tunnel junction layer has a stacked structure of an n+ layer and a p+ layer, and the groove reaches up to at least the p+ layer from the surface of the mesa structure.

3. The semiconductor light-emitting element according to claim 2,
wherein the groove is formed to reach up to the embedded semiconductor layer.

4. The semiconductor light-emitting element according to claim 3,
wherein the groove is formed to reach up to a growth substrate side with respect to a top surface of the columnar semiconductor layer.

5. The semiconductor light-emitting element according to claim 1,
wherein the groove is formed in a region except for the columnar semiconductors, in a plan view.

6. The semiconductor light-emitting element according to claim 1,
wherein the groove is formed in a dot shape or a linear shape.

7. A method for manufacturing a semiconductor light-emitting element, the method comprising:
a first growth step of forming, on a growth substrate, a plurality of columnar semiconductor layers and a p-type embedded semiconductor layer;
a second growth step of forming, on the embedded semiconductor layer, a tunnel junction layer and an n-type semiconductor layer;

a mesa forming step of forming a mesa structure in the embedded semiconductor layer, the tunnel junction layer, and the n-type semiconductor layer to expose the tunnel junction layer from a side surface of the mesa structure; and an activation step of activating a p+ layer included in the tunnel junction layer, after the mesa forming step.

8. The method for manufacturing a semiconductor light-emitting element according to claim 7, further comprising:

a groove etching step of forming, by etching, a groove that reaches up to at least the p+ layer from a surface of the mesa structure, after the second growth step and before the activation step.

9. The method for manufacturing a semiconductor light-emitting element according to claim 7, wherein the second growth step includes a groove mask removal step of:

forming a mask on a part of the embedded semiconductor layer;

growing the tunnel junction layer and the n-type semiconductor layer, by selective growth using the mask; and removing the mask to form a groove, after the second growth step and before the activation step.

\*　\*　\*　\*　\*